United States Patent
Jeon

(10) Patent No.: US 9,369,129 B2
(45) Date of Patent: Jun. 14, 2016

(54) SEMICONDUCTOR DEVICE INCLUDING AN ARBITER CELL

(71) Applicant: SK HYNIX INC., Icheon (KR)

(72) Inventor: Seon Kwang Jeon, Icheon (KR)

(73) Assignee: SK HYNIX INC., Icheon (KR)

( * ) Notice: Subject to any disclaimer, the term of this patent is extended or adjusted under 35 U.S.C. 154(b) by 326 days.

(21) Appl. No.: 14/135,302

(22) Filed: Dec. 19, 2013

(65) Prior Publication Data

US 2015/0102837 A1    Apr. 16, 2015

(30) Foreign Application Priority Data

Oct. 14, 2013 (KR) .................. 10-2013-0121998

(51) Int. Cl.
*H03K 19/173* (2006.01)
*H03K 19/003* (2006.01)
*H03K 19/20* (2006.01)

(52) U.S. Cl.
CPC .............. *H03K 19/003* (2013.01); *H03K 19/20* (2013.01)

(58) Field of Classification Search
CPC ... G11C 7/22; G11C 7/1006; G11C 11/40603
USPC ............. 326/37–41, 47; 365/189.011, 189.08
See application file for complete search history.

(56) References Cited

U.S. PATENT DOCUMENTS

| | | | | |
|---|---|---|---|---|
| 5,541,916 A * | 7/1996 | Nobuyuki | ........... | H04L 12/5601 370/395.4 |
| 7,701,252 B1 * | 4/2010 | Chow | .................. | H01L 25/0657 326/101 |
| 8,274,309 B2 | 9/2012 | Madurawe | | |
| 9,030,253 B1 * | 5/2015 | Ngai | ........................ | H01L 25/00 327/564 |
| 2010/0078790 A1 * | 4/2010 | Ito | ............................ | G11C 5/02 257/686 |
| 2011/0007588 A1 * | 1/2011 | Li | ............................. | G11C 5/02 365/200 |
| 2011/0246828 A1 * | 10/2011 | Monchiero | ......... | G06F 11/1402 714/31 |
| 2012/0066432 A1 * | 3/2012 | Miura | .................... | G06F 13/161 711/102 |
| 2012/0124532 A1 * | 5/2012 | Coteus | ................ | H01L 25/0657 716/104 |
| 2013/0168672 A1 * | 7/2013 | Lewis | ..................... | H01L 22/22 257/48 |
| 2013/0262761 A1 * | 10/2013 | Oh | ........................ | G06F 3/0659 711/114 |
| 2014/0027771 A1 * | 1/2014 | Satoh | .................... | H01L 23/544 257/48 |
| 2014/0068203 A1 * | 3/2014 | Son | ..................... | G11C 11/4076 711/155 |
| 2014/0253196 A1 * | 9/2014 | Du | ....................... | H01L 27/0688 327/202 |
| 2014/0317460 A1 * | 10/2014 | Kleveland | .............. | G11C 29/44 714/710 |
| 2015/0095866 A1 * | 4/2015 | Cohen | ............ | G01R 31/318335 716/113 |

FOREIGN PATENT DOCUMENTS

JP    2012-099162 A    5/2012

\* cited by examiner

*Primary Examiner* — Jason M Crawford

(57) ABSTRACT

A semiconductor device is implemented with a technology for removing a command bubbling generated when performing a rank-to-rank switching on chips that are stacked and interconnected through a through silicon via (TSV). The semiconductor device includes a first memory, a second memory stacked over the first memory to input/output data through a TSV, and an arbiter configured to adjust first data received from the first memory and second data received from the second memory through the TSV and provide the adjusted data to an input/output (I/O) pad.

19 Claims, 11 Drawing Sheets

SEMICONDUCTOR DEVICE INCLUDING AN ARBITER CELL

CROSS-REFERENCE TO RELATED APPLICATION

This application claims priority based upon Korean patent application No. 10-2013-0121998, filed on Oct. 14, 2013, the disclosure of which is hereby incorporated in its entirety by reference herein.

BACKGROUND OF THE INVENTION

Embodiments of the present invention relate to a semiconductor device, and more particularly, to technology capable of adjusting an output duration of data when performing a rank-to-rank switching on chips that are stacked and interconnected through a through silicon via (TSV).

The demand for highly integrated and high-capacity semiconductor memories is rapidly increasing as high-performance electronic appliances become increasingly smaller and as demand for mobile products increases. There are a variety of methods for increasing the storage capacity of semiconductor memories.

Among these methods, one method is to increase the degree of integration of semiconductor chips. Another method is to assemble a plurality of semiconductor chips into a single semiconductor package.

Generally, increasing the degree of integration of semiconductor chips requires much more effort, cost, and time. On the other hand, in assembling semiconductor chips into a single semiconductor package, it is possible to provide an increased storage capacity of semiconductor memories by changing the packaging method.

In addition, methods of assembling the semiconductor chips are more advantageous than methods of increasing the degree of integration of the semiconductor chips in terms of costs, effort, and time consumed in research and development. As a result, manufacturers of semiconductor memories have made efforts to increase storage capacity of semiconductor memory devices through multi-chip packaging in which multiple semiconductor chips are assembled to a single semiconductor package.

For example, in order to assemble a plurality of semiconductor chips into a single semiconductor package, there is a method for horizontally assembling the semiconductor chips and there is a method for vertically assembling the semiconductor chips into the single semiconductor package. However, due to the miniaturization of electronic appliances, most manufacturers prefer to use Stack Type Multi Chip Packaging, in which multiple semiconductor chips are vertically stacked and packaged. A representative example of such stack packages is implemented using a Through Silicon Via (TSV).

In a plurality of semiconductor chips that are stacked using TSVs, data (DQ) pads are interconnected through the TSVs so that the DQ pads may output data through a rank control. In this case, since data collision or floating between pieces of output data (DQ) may occur, a data training process needs to be carried out. Data collision may occur when at least two pieces of output data overlap, and data floating may occur when there is discontinuity between pieces of output data.

However, when adjusting the input/output (I/O) timing of data or performing rank-to-rank switching using the data training process during a power-up operation, command bubbling (e.g., data collision or data floating) may occur. If command bubbling occurs, it is difficult to control data, and a throughput of a stack package may be deteriorated.

FIG. 1 is a conceptual diagram illustrating data collision occurring in a TSV-based package in which a plurality of memory chips is stacked. As shown in FIG. 1, if data read from a first memory chip (Memory 1) overlaps with data read from a second memory chip (Memory 0) in the package, data collision occurs between the two pieces of data when they are output through a single TSV.

FIG. 2 is a conceptual diagram illustrating data floating occurring in a TSV-based package. In the package, if there is discontinuity between data read from the first memory chip (Memory 1) and data read from the second memory chip (Memory 0), data floating occurs between the two pieces of data when they are output through a single TSV.

BRIEF SUMMARY OF THE INVENTION

Embodiments of the present invention are directed to providing a semiconductor device that substantially obviates one or more problems due to limitations and disadvantages of the related art.

Embodiments of the present invention relate to technology capable of removing a command bubbling, which is generated when performing a rank-to-rank switching on semiconductor chips that are stacked, using an arbiter.

Embodiments of the present invention are directed to preventing data collision in a multi-chip semiconductor package.

Embodiments of the present invention are directed to preventing a data floating phenomenon in a multi-chip semiconductor package.

In accordance with an embodiment of the embodiment, a semiconductor device includes: a first memory; a second memory deposited over the first memory so as to input/output data through a through silicon via (TSV); and an arbiter contained in the first memory, configured to arbitrate between first data received from a first memory and second data received from a second memory through the TSV, and provide the arbitration result to an input/output (I/O) pad.

The arbiter may perform a logic operation between the first data and the second data when the first data overlaps with the second data, so that data is sequentially output through the I/O pad.

The arbiter may include: an arbiter cell configured to output timing-adjusted third and fourth data by performing a logic operation between the first data and the second data; and a combination unit configured to combine the third data with the fourth data, and output the combination result to the I/O pad.

The arbiter cell may include: a plurality of NAND gates configured to perform a NAND operation between the first data and the second data so as to output a first signal and a second signal; an exclusive-NOR (XNOR) gate configured to perform an exclusive-NOR (XNOR) operation between the first signal and the second signal so as to output a third signal; and a plurality of NOR gates configured to perform a NOR operation among the first, second, and third signals, and output the third data and the fourth data.

The combination unit may be configured to output logic-high data when at least one of the third data and the fourth data is at a logic high level.

The combination unit may include an OR gate configured to perform an OR operation between the third data and the fourth data.

When a delay time between the first data and the second data occurs in a predetermined duration, the arbiter may adjust a delay time point by performing a logic operation between the first data and the second data, and sequentially output data through the I/O pad.

The arbiter may include: an arbiter cell configured to output timing-adjusted third, fourth, and fifth data by performing a logic operation between the first data and the second data; and a combination unit configured to combine the third data, the fourth data, and the fifth data with one another, and output the combination result to the I/O pad.

The arbiter cell may include: a plurality of NAND gates configured to perform a NAND operation between the first data and the second data so as to output a first signal and a second signal; an exclusive-NOR (XNOR) gate configured to perform an exclusive-NOR (XNOR) operation between the first signal and the second signal so as to output a third signal; a plurality of NOR gates configured to perform a NOR operation among the first, second, and third signals, and output the third data and the fourth data; and an AND gate configured to perform an AND operation the first signal, the second signal, and an inversion signal of the third signal, and output fifth data.

The combination unit may be configured to output logic-high data when at least one of the third data, the fourth data, and the fifth data is at a logic high level.

The combination unit may include an OR gate configured to perform an OR operation among the third data, the fourth data, and the fifth data.

The through silicon via (TSV) may be formed as a via-middle shape.

It is to be understood that both the foregoing general description and the following detailed description of embodiments of the present invention are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Reference will now be made in detail to various embodiments of the present invention, examples of which are illustrated in the accompanying drawings. Wherever possible, the same reference numbers will be used throughout the drawings to refer to the same or like parts.

Figure 1:
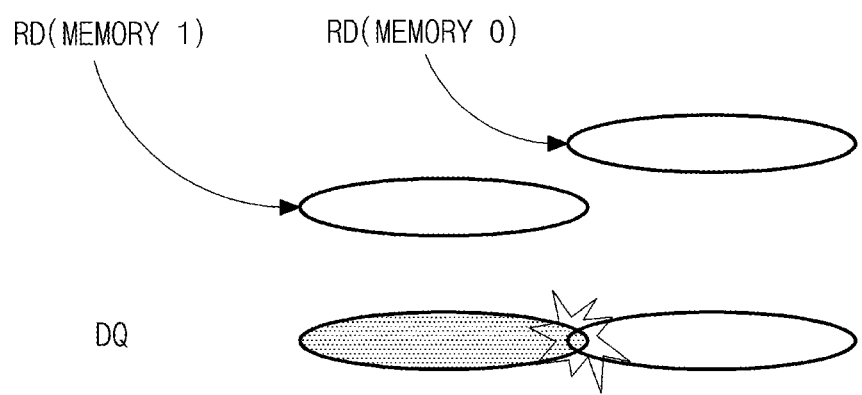
FIG. 1 illustrates data collision generated in a conventional semiconductor device.
Figure 2:
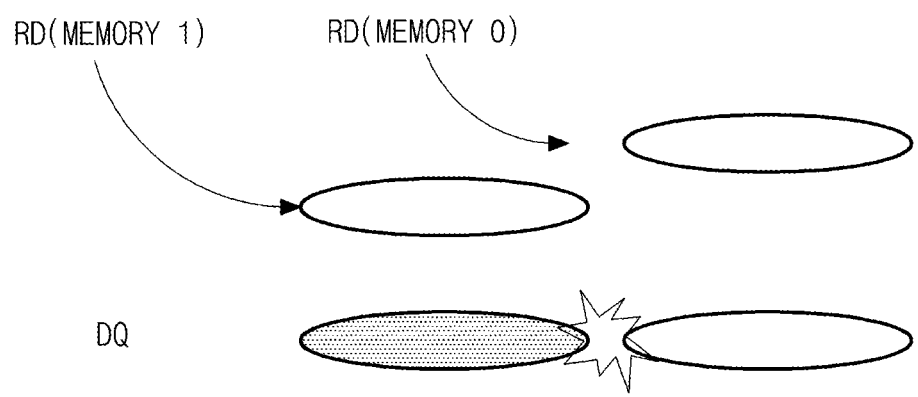
FIG. 2 illustrates data floating generated in a conventional semiconductor device.
Figure 3:
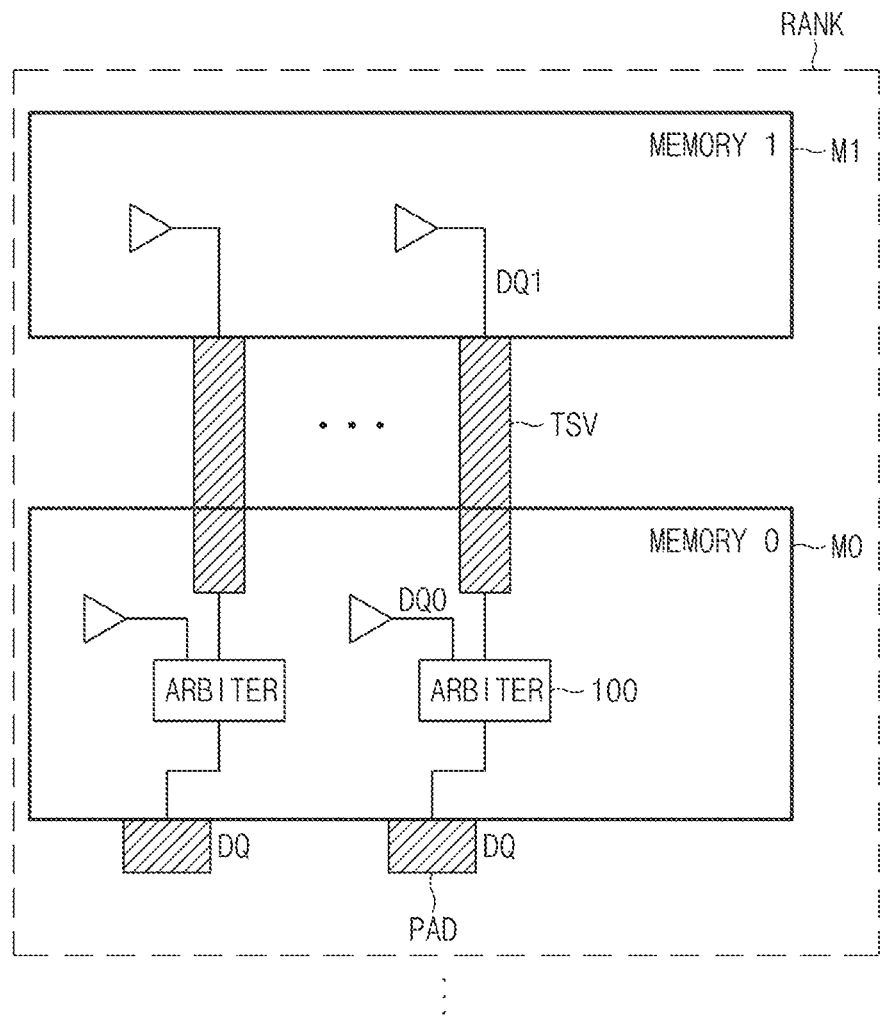
FIG. 3 illustrates a schematic diagram of a semiconductor device according to an embodiment.

FIG. 3 illustrates a schematic diagram of a semiconductor device according to an embodiment. The semiconductor device includes a package in which a plurality of chips is stacked. For convenience of illustration, FIG. 3 shows two memory chips M0 and M1. The memory chips M0 and M1 are interconnected through silicon vias (TSVs). The memory chips M0 and M1 may transmit/receive data, address, and control signals through the TSVs.

When the memory chips M0 and M1 are stacked using the TSVs, data (DQ) pads are interconnected so that data is output through a rank control. In an embodiment, the semiconductor device includes a plurality of ranks, and each rank includes a plurality of memory chips. In an embodiment, the memory chips M0 and M1 are included in the same rank. Each of the memory chips M0 and M1 may be a Dynamic Random Access Memory (DRAM), but embodiments are not limited thereto.

When the memory chips M0 and M1 are stacked using the TSVs, pillars of the TSVs may be formed through the memory chips M0 and M1. However, in another embodiment, assuming that memory chips M0 and M1 are implemented as a via middle according to fabrication processes, a position of a TSV pillar may be different from a position of a metal routing. Accordingly, a signal received from the TSV pillar may be independently used.

In an embodiment, the memory chip M0 located at the lowermost layer from among the memory chips M0 and M1 includes an arbiter 100. In another embodiment, the arbiter 100 may be included in any one of memory chips in the stack package. That is, the arbiter 100 may be included in the memory chip M1 instead of the memory chip M0.

The arbiter 100 may combine data DQ1 received from the upper memory chip M1 through the TSV with data DQ0 received from the lower memory chip M0 to adjust output durations of the data DQ1 and the data DQ0. As a result, the resultant data DQ obtained by adjusting the output durations of the data DQ1 and DQ0 is output to an I/O pad PAD. In an embodiment, since the arbiter 100 outputs a combination result of data input thereto by adjusting output durations of the input data, collision of data can be avoided.

The semiconductor device may include a plurality of TSVs formed to interconnect the plurality of memories M0 and M1. However, operations and structures of the semiconductor device will be described with reference to a single TSV for illustrative convenience.

Figure 4:
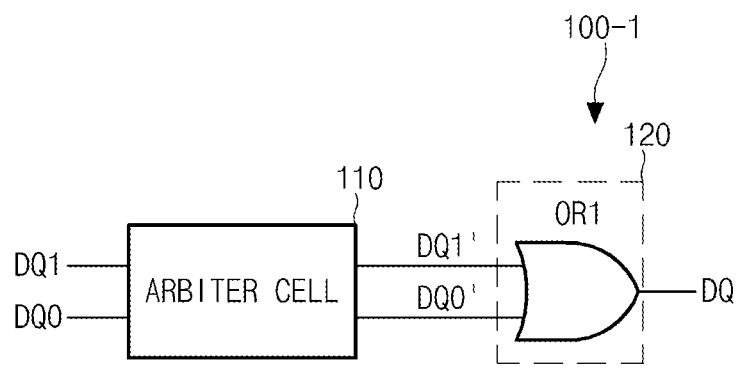
FIG. 4 illustrates a configuration of an arbiter according to an embodiment.

FIG. 4 illustrates a configuration of an arbiter 100-1 according to an embodiment.

The arbiter 100-1 includes an arbiter cell 110 and a combination unit 120. The arbiter cell 110 receives the data DQ1 from the upper memory chip M1 and the data DQ0 from the lower memory chip M0 through a single TSV, adjusts output durations of the data DQ1 and DQ0, and outputs data DQ1' and data DQ0' obtained by adjusting the output durations of the data DQ1 and DQ0.

The combination unit 120 combines the data DQ1' with the data DQ0', and outputs the combined data DQ to the I/O pad PAD. In an embodiment, the combination unit 120 is configured to output the combined data DQ as data having a logic high level when at least one of the data DQ1' and the data DQ0' is activated to a logic high level. In an embodiment, the combination unit 120 includes an OR gate OR1 for performing an OR operation on the data DQ1' and the data DQ0'.

Figure 5:
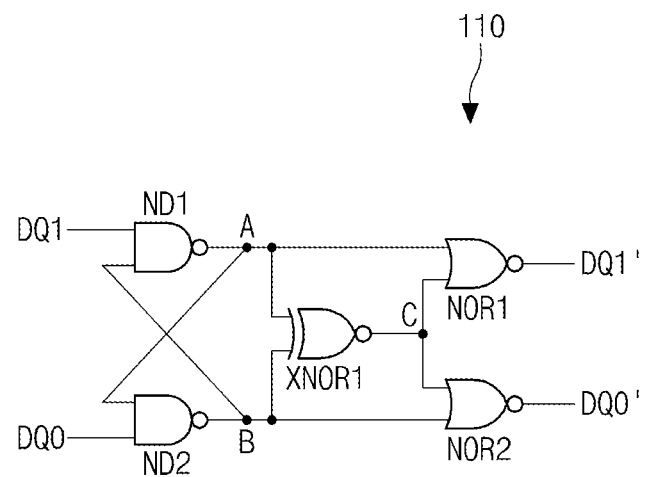
FIG. 5 illustrates a circuit diagram of an arbiter cell shown in FIG. 4 according to an embodiment.

FIG. 5 illustrates a circuit diagram of the arbiter cell 110 shown in FIG. 4 according to an embodiment. The arbiter cell 110 includes a plurality of NAND gates ND1 and ND2, an exclusive-NOR (XNOR) gate XNOR1, and a plurality of NOR gates NOR1 and NOR2.

The NAND gate ND1 performs a NAND operation on the data DQ1 and a signal of an output node B of the NAND gate ND2, and outputs a NAND operation result to an output node A thereof. The NAND gate ND2 performs a NAND operation on the data DQ0 and a signal of the node A, and outputs a NAND operation result to the node B.

The XNOR gate XNOR1 performs an XNOR operation on the signal of the node A and the signal of the node B, and outputs an XNOR operation result to an output node C thereof. The NOR gate NOR1 performs a NOR operation on the signal of the node A and a signal of the node C, and outputs the data DQ1'. The other NOR gate NOR2 performs a NOR operation on the signal of the node B and the signal of the node C, and outputs the data DQ0'.

Figure 6:
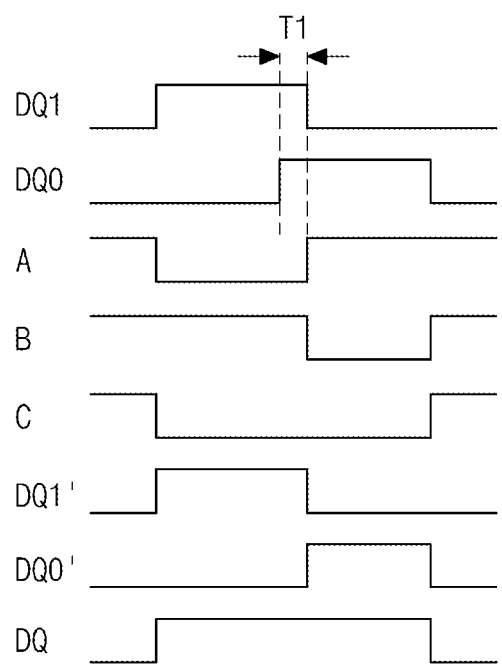
FIG. 6 is a timing diagram illustrating an operation of the arbiter shown in FIGS. 4 and 5.

FIG. 6 is a timing diagram illustrating an operation of the arbiter 100-1 shown in FIGS. 4 and 5.

The timing diagram illustrates that data DQ1 received from the upper memory chip M1 overlaps with data DQ0 received from the lower memory chip M0 within a duration T1. During an overlapping period, i.e., the duration T1, both of the data DQ1 and the data DQ0 are in an activated state, e.g., a logic high level.

The arbiter cell 110 receives the data DQ1 and the data DQ0, and performs a NAND operation on the data DQ1 and the data DQ0. Thus, the output durations of the data DQ1 and DQ0 are adjusted. As a result, signals of the nodes A and B output from the NAND gates ND1 and ND2 are generated that do not overlap with each other within the duration T1. That is, the period of overlap T1 of the data DQ1 and DQ0 is removed by converting the data DQ1 and DQ0 into the signals of the nodes A and B.

Thereafter, the arbiter cell 110 performs an XNOR operation on the signal of the node A and the signal of the node B, and outputs the combined result to the node C. The signal of the node C has a logic low level when the signal of the node A has a different logic level from that of the signal of the node B and a logic high level when the signals of the nodes A and B have the same logic level.

After that, the signal of the node C is combined with the signal of the node A through the NOR gate NOR1, and thus data DQ1' is output. Data DQ1' has a logic high level for a duration that corresponds to a duration of a logic high level of the data DQ1. The signal of the node C is combined with the signal of the node B through the NOR gate NOR2, and thus data DQ0' is output. The data DQ0' has a logic high level for a duration obtained by removing the duration T1 from a duration of a logic high level of the data DQ0. Therefore, an activated state of the data DQ1' and an activated state of the data DQ0' do not have an overlapping period.

The OR gate OR1 in the combination unit 120 performs an OR operation on the data DQ1' and the data DQ0', and outputs data DQ that has a logic high level while at least one of the data DQ1' and the data DQ0' has a logic high level. As described above, there is no overlapping period between the logic high levels of data DQ1' and the data DQ0'. As a result, data collision in the I/O pad PAD does not occur.

Figure 7:
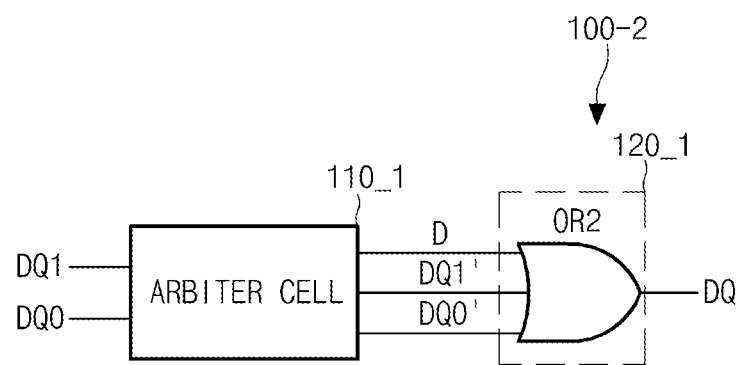
FIG. 7 illustrates a configuration of an arbiter according to another embodiment.

FIG. 7 illustrates a configuration of an arbiter 100-2 according to another embodiment.

The arbiter 100-2 includes an arbiter cell 110_1 and a combination unit 120_1. The arbiter cell 110_1 receives the data DQ1 from the upper memory chip M1 and the data DQ0 from the lower memory chip M0 through a single TSV, adjusts output durations of the data DQ1 and DQ0, and outputs data D, data DQ1', and data DQ0'.

The combination unit 120_1 combines the data D, the data DQ1', and the data DQ0', and outputs a combined data DQ to the I/O pad PAD. In an embodiment, the combination unit 120_1 is configured to output the data DQ at a logic high level when at least one of the data D, the data DQ1', and the data DQ0' is activated to a logic high level. In an embodiment, the combination unit 120_1 includes an OR gate OR2 for performing an OR operation on the data D, the data DQ1', and the data DQ0'.

Figure 8:
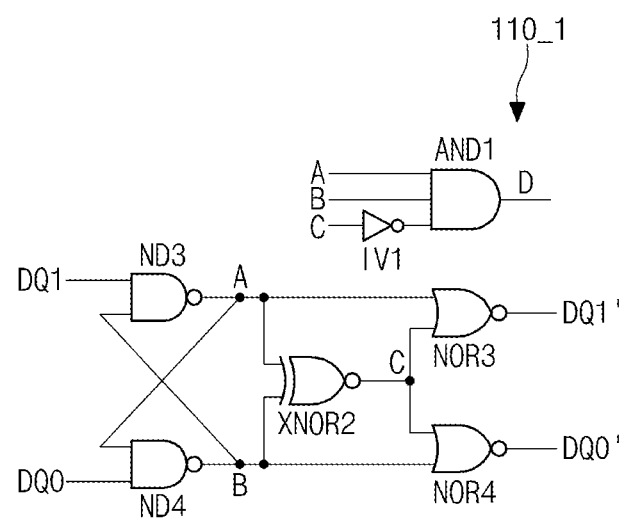
FIG. 8 illustrates a circuit diagram of an arbiter cell shown in FIG. 7 according to an embodiment.

FIG. 8 illustrates a circuit diagram of the arbiter cell 110_1 shown in FIG. 7 according to an embodiment. The arbiter cell 110_1 includes a plurality of NAND gates ND3 and ND4, an exclusive-NOR gate XNOR2, a plurality of NOR gates NOR3 and NOR4, an AND gate AND1, and an inverter IV1.

The NAND gate ND3 performs a NAND operation on the data DQ1 and a signal of an output node B of the NAND gate ND4, and outputs a NAND operation result to an output node A thereof. The NAND gate ND4 performs a NAND operation on the data DQ0 and a signal of the node A, and outputs a NAND operation result to the node B.

The XNOR gate XNOR2 performs an XNOR operation on the signal of the node A and the signal of the node B, and outputs an XNOR operation result to an output node C thereof. The NOR gate NOR3 performs a NOR operation on the signal of the node A and a signal of the node C, and outputs the data DQ1'. The other NOR gate NOR4 performs a NOR operation on the signal of the node B and the signal of the node C, and outputs the data DQ0'.

In addition, the AND gate AND1 performs an AND operation on the signal of the node A, the signal of the node B, and a signal obtained by inverting the signal of the node C using the inverter IV1, and outputs the data D. Therefore, when the signals of the nodes A and B have a logic high level and the signal of the node C has a logic low level, the AND gate AND1 outputs the data D at a logic high level.

Figure 9:
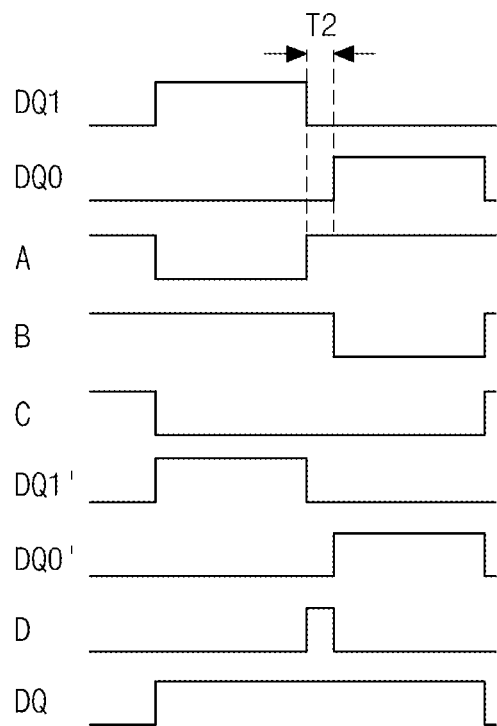
FIG. 9 is a timing diagram illustrating an operation of the arbiter shown in FIGS. 7 and 8.

FIG. 9 is a timing diagram illustrating an operation of the arbiter 100-2 shown in FIGS. 7 and 8 according to an embodiment.

The timing diagram illustrates that a discontinuity occurs between data DQ1 received from the upper memory chip M1 and data DQ0 received from the lower memory chip M0. In a floating period, i.e., the duration T2, both of the data DQ1 and DQ0 are in a deactivated state, e.g., a logic low level.

The arbiter cell 110_1 receives the data DQ1 and the data DQ0, and performs a NAND operation on the data DQ1 and the data DQ0, and outputs the signals that result from the NAND operation to the nodes A and B, respectively.

Thereafter, the arbiter cell 110-1 performs an XNOR operation on the signal of the node A and the signal of the node B, and outputs a combined result to the node C. The signal of the node C has a logic low level when the signal of the node A has a different logic level from that of the signal of the node B, and a logic high level when the signals of the nodes A and B have the same logic level.

After that, the signal of the node C is combined with the signal of the node A through the NOR gate NOR3, and thus the data DQ1' is output. The data DQ1' has a logic high level for a duration that corresponds to a duration of a logic high level of the data DQ1. The signal of the node C is combined with the signal of the node B through the NOR gate NOR4, and thus the data DQ0' is output. The data DQ0' has a logic high level for a duration of a logic high level of the data DQ0.

In addition, the signal of the node A, the signal of the node B, and the inverted signal of the signal of the node C are combined using the AND gate AND1 to output the data D. Thus, as described above, the data D has a logic high level when the signals of the nodes A and B and the inverted signal have a logic high level. A duration where the data D is in an activated state corresponds to the duration T2.

The OR gate OR2 in the combination unit 120-1 performs an OR operation on the data DQ1', the data DQ0', and the data D, and outputs data DQ that has a logic high level while at least one of the data DQ1', the data DQ0', and the data D has a logic high level. As shown in FIG. 9, since the data D is activated to a logic high level when both of the data DQ1' and the data DQ0' are deactivated to a logic low level, the data DQ is activated to a logic high level without the floating period T2, and thus data floating does not occur in the I/O pad PAD.

As described, the arbiter 100-2 can detect a discontinuity in timing, i.e., a floating phenomenon, between the data DQ1 and the data DQ0, generate the data D corresponding to the discontinuity, and compensate for the discontinuity using the data D. As a result, the data DQ can be output to the I/O pad without the floating period T2. That is, in FIG. 9, since the floating period T2 in a logic low state is compensated by the data D having a logic high level, the data DQ1 and DQ0 having a logic high level can be correctly output to the I/O pad as logic-high data without being disconnected by erroneous data, i.e., logic-low data.

Figure 10:
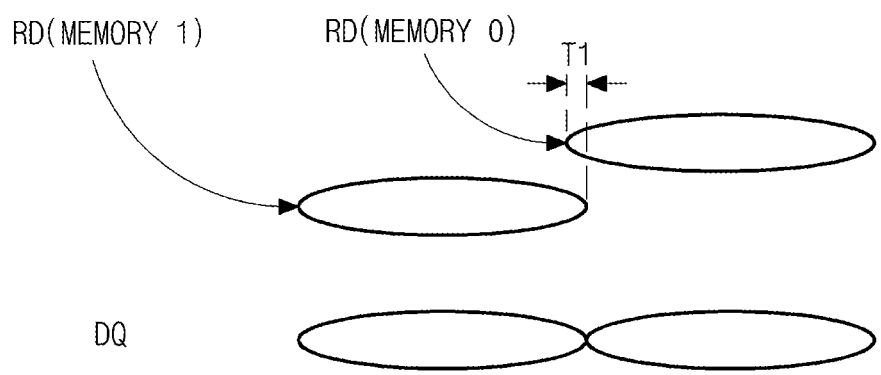
FIG. 10 is a conceptual diagram illustrating how data collision is prevented from occurring in a semiconductor device according to an embodiment.

FIG. 10 is a conceptual diagram illustrating how data collision is prevented in a semiconductor device according to an embodiment.

Referring to FIG. 10, in a package in which a plurality of memory chips (Memory 0 and Memory 1) are stacked, data read from one memory chip (Memory 1) may overlap with data read from another memory chip (Memory 0) within a predetermined duration T1.

In accordance with an embodiment, although the data read from the memory chip (Memory 0) overlaps with the data read from the memory chip (Memory 1), there is no data collision in output data DQ. In other words, when data read from the first memory chip (Memory 0) overlaps with data read from the second memory chip (Memory 1), output durations of the data are adjusted so that the data is sequentially output through an I/O pad PAD. As a result, there is no data collision.

Figure 11:
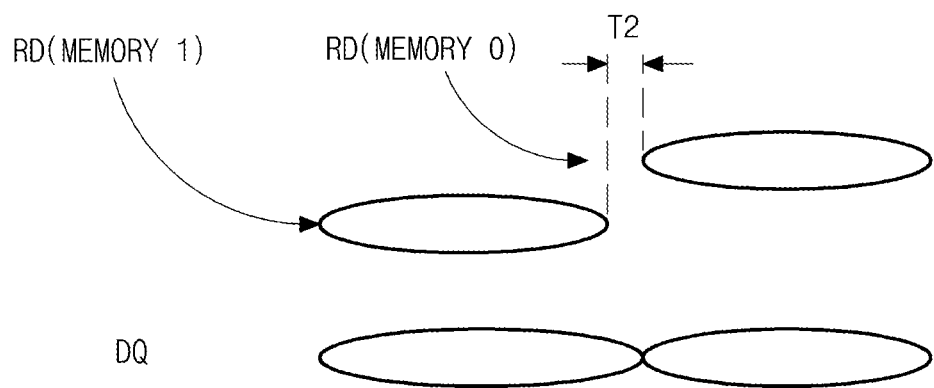
FIG. 11 is a conceptual diagram illustrating how data floating is prevented in a semiconductor device according to an embodiment.

FIG. 11 is a conceptual diagram illustrating how data floating is prevented from occurring in a semiconductor device according to an embodiment.

Referring to FIG. 11, in a package in which a plurality of memory chips (Memory 1 and Memory 0) are stacked, discontinuity between data read from the memory chip (Memory 1) and data read from the memory chip (Memory 0) may occur within a predetermined duration T2.

In accordance with an embodiment, although the data discontinuity occurs between these two pieces of data, output data DQ is not discontinuous. In other words, assuming that there is a discontinuity between two pieces of data read from two memory chips (Memory 0 and Memory 1), output durations of the two pieces of data are adjusted such that the two pieces of data are sequentially output through an I/O pad PAD without the discontinuity. As a result, there is no data floating.

The above-mentioned description has disclosed detailed explanation of embodiments of the invention. For reference, embodiments may include additional structures for better understanding of the invention as necessary although the additional structures are not directly associated with technical ideas of the present invention. In addition, activation, deactivation, high or low constructions for indicating activation states of a signal and circuit may be changed according to the embodiment. In the logic circuit of the arbiter 100-1 or 100-2, a NAND gate, an exclusive-NOR (XNOR) gate, a NOR gate, an AND gate, and an OR gate may be modified according to embodiments. The above-mentioned circuit modifications may be very frequently generated, such that associated modifications can be easily appreciated by those skilled in the art, and as such a detailed description thereof will herein be omitted for illustrative convenience.

As is apparent from the above description, a semiconductor device according to an embodiment may have the following effects.

First, a semiconductor device according to an embodiment can prevent data collision from occurring in a data I/O pad when a rank-to-rank switching is performed, by using an arbiter cell.

Second, a semiconductor device according to an embodiment need not perform a separate training operation for a timing control.

Third, a semiconductor device according to an embodiment can improve a timing margin through minute or precise tuning after completion of a coarse tuning action.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
    a first chip;
    a second chip stacked over the first chip, the first and second chips inputting or outputting data through a through silicon via (TSV); and
    an arbiter configured to adjust an output duration of first data read out of the first chip and an output duration of second data read out of the second chip, and provide output-duration adjusted data to an input/output (I/O) pad of the semiconductor device.

2. The semiconductor device according to claim 1, wherein the arbiter performs a logical operation on the first data and the second data when the output duration of the first data overlaps with that of the second data to sequentially output the first and second data through the I/O pad without an overlapping period between the first and second data.

3. The semiconductor device according to claim 1, wherein the arbiter includes:
    an arbiter cell configured to adjust the output durations of the first data and the second data to output third data and fourth data; and a combination unit configured to combine the third data with the fourth data and output the combined data as the output-duration adjusted data to the I/O pad.

4. The semiconductor device according to claim 3, wherein the arbiter cell includes:
   a plurality of NAND gates configured to perform a NAND operation on the first data and the second data to output a first signal and a second signal, respectively;
   an exclusive-NOR (XNOR) gate configured to perform an exclusive-NOR (XNOR) operation on the first signal and the second signal to output a third signal; and
   a plurality of NOR gates configured to perform a NOR operation on the first, second, and third signals to output the third data and the fourth data.

5. The semiconductor device according to claim 3, wherein the combination unit is configured to output logic-high data when at least one of the third data and the fourth data has a logic high level.

6. The semiconductor device according to claim 3, wherein the combination unit includes an OR gate configured to perform an OR operation on the third data and the fourth data.

7. The semiconductor device according to claim 1, wherein:
   when a discontinuity occurs between an output duration of the first data and that of the second data, the arbiter detects a period where the discontinuity occurs by performing a logical operation on the first data and the second data and compensates for the discontinuity to sequentially output the first and second data through the I/O pad without the discontinuity.

8. The semiconductor device according to claim 7, wherein the arbiter includes:
   an arbiter cell configured to perform a logical operation on the first data and the second data to output third, fourth, and fifth data; and
   a combination unit configured to combine the third data, the fourth data, and the fifth data and output the combined data as the output-duration adjusted data to the I/O pad.

9. The semiconductor device according to claim 8, wherein the arbiter cell includes:
   a plurality of NAND gates configured to perform a NAND operation on the first data and the second data to output a first signal and a second signal, respectively;
   an exclusive-NOR (XNOR) gate configured to perform an exclusive-NOR (XNOR) operation on the first signal and the second signal to output a third signal;
   a plurality of NOR gates configured to perform a NOR operation on the first, second, and third signals to output the third data and the fourth data, respectively; and
   an AND gate configured to perform an AND operation on the first signal, the second signal, and an inversion signal of the third signal to output the fifth data.

10. The semiconductor device according to claim 8, wherein the combination unit is configured to output logic-high data when at least one of the third data, the fourth data, and the fifth data has a logic high level.

11. The semiconductor device according to claim 8, wherein the combination unit includes an OR gate configured to perform an OR operation on the third data, the fourth data, and the fifth data.

12. The semiconductor device according to claim 1, wherein the TSV has a via-middle shape.

13. The semiconductor device according to claim 1, wherein the arbiter is located in any one of the first and second chips.

14. The semiconductor device according to claim 1, wherein data of the first and second chips is input or output through a rank control.

15. The semiconductor device according to claim 1, wherein the first and second chips are dynamic random access memory chips.

16. A semiconductor device comprising:
   a plurality of ranks each of which comprises a plurality of chips,
   wherein a rank includes:
      a first chip;
      a second chip stacked over the first chip, the first and second chips inputting or outputting data through a through silicon via (TSV); and
      an arbiter configured to adjust an output duration of first data read out of the first chip and an output duration of second data read out of the second chip, and provide output-duration adjusted data to an input/output (I/O) pad of the semiconductor device.

17. The semiconductor device according to claim 16, wherein the arbiter is located in any one of the first and second chips.

18. The semiconductor device according to claim 16, wherein the arbiter performs a logical operation on the first data and the second data when the output duration of the first data overlaps with that of the second data to sequentially output the first and second data through the I/O pad without an overlapping period between the first and second data.

19. The semiconductor device according to claim 16, wherein:
   when a discontinuity occurs between an output duration of the first data and that of the second data, the arbiter detects a period where the discontinuity occurs by performing a logical operation on the first data and the second data and compensates for the discontinuity to sequentially output the first and second data through the I/O pad without the discontinuity.

* * * * *